United States Patent [19]

Nightingale et al.

[11] Patent Number: 5,220,274
[45] Date of Patent: Jun. 15, 1993

[54] SURFACE MOUNTED ELECTRICAL SWITCH AND PROBE STRUCTURE

[75] Inventors: Mark W. Nightingale, Washougal, Wash.; Jonathan E. Myers, Aloha, Oreg.

[73] Assignee: Tektronix, Inc., Wilsonville, Oreg.

[21] Appl. No.: 864,765

[22] Filed: Apr. 7, 1992

[51] Int. Cl.$^5$ .............................................. G01R 1/06
[52] U.S. Cl. ................................... 324/72.5; 324/149; 324/158 P; 200/531
[58] Field of Search .................... 324/72.5, 149, 158 P; 200/5 R, 178, 519, 531, 532

[56] References Cited

U.S. PATENT DOCUMENTS

| | | |
|---|---|---|
| 3,315,163 | 4/1967 | Lutz ....................................... 324/149 |
| 4,013,855 | 3/1977 | Reichen et al. . |
| 4,031,345 | 6/1977 | Garcia . |
| 4,491,703 | 1/1985 | Jaklic . |
| 4,590,344 | 5/1986 | Kikta et al. . |
| 5,061,892 | 10/1991 | O'Hara et al. . |

Primary Examiner—Jack B. Harvey
Attorney, Agent, or Firm—William K. Bucher

[57] ABSTRACT

An electrical switch usable in an electrical test probe has electrical contact pads formed on a substrate acting as fixed electrical switch contacts. A frame member is laterally disposed from the fixed electrical switch contacts. An actuator is disposed within the frame member having a movable switch pole contact extending from the actuator past the frame member for wipingly engaging the fixed electrical contacts on the substrate as the actuator is moved between first and second switch positions. For use in a switchable passive voltage probe, the electrical switch is formed on a circuit board that is disposed in an electrically conductive tubular body. Insulating material surrounds the fixed switch contacts on the circuit board to electrically isolate the contacts from the tubular body. The switch pole contact reaches into the electrically isolated region to perform the switching function.

19 Claims, 3 Drawing Sheets

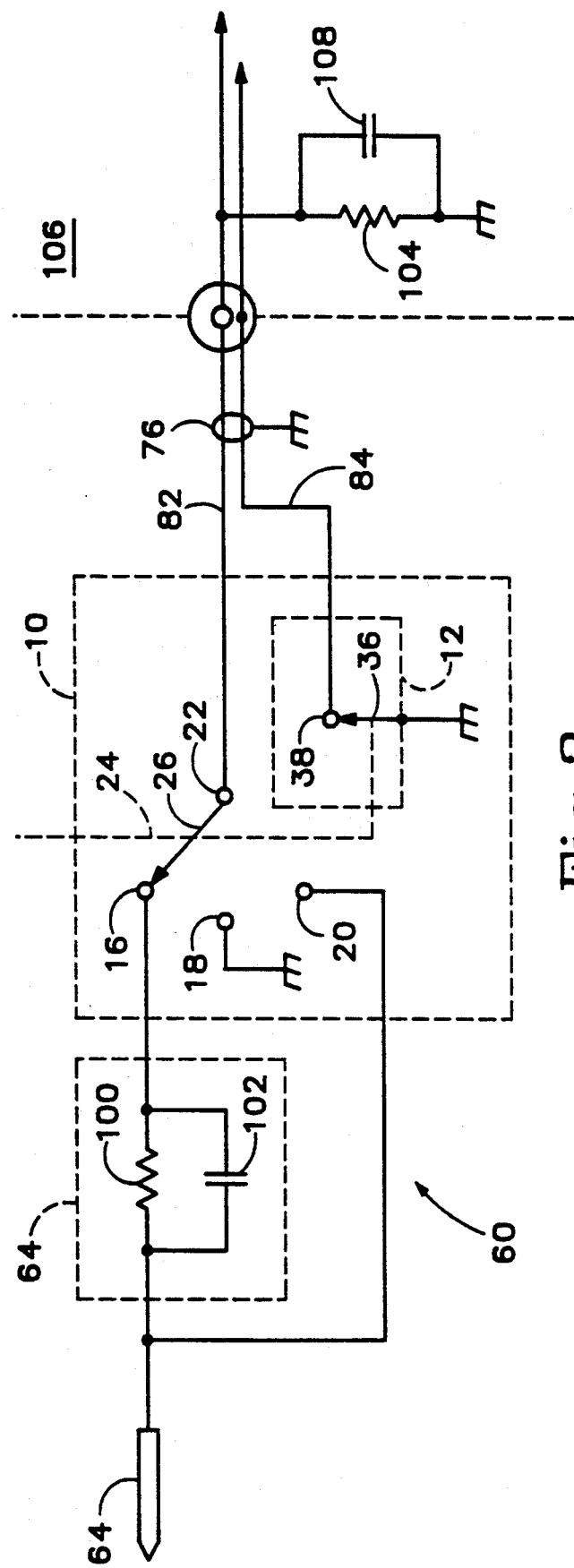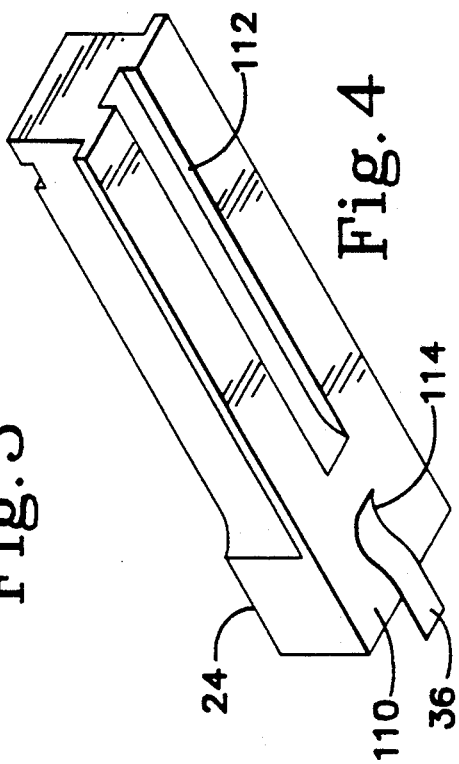

SURFACE MOUNTED ELECTRICAL SWITCH AND PROBE STRUCTURE

BACKGROUND OF THE INVENTION

The present invention related electrical switches and more particularly to a surface mounted electrical switch usable in electrical test probes.

Electrical switches are generally enclosed packages having an exposed actuator mechanism permitting an external force to be applied to operate the switch. The actuator is connected to a pole contact, which engages or disengages fixed contacts in the switch during operation. The fixed contacts are connected to leads that extend from the package for connecting the switch to an electrical circuit.

Various types of electrical switch packages are being used in the electronics industry. DIP switch packages are multi-switch devices that are mounted directly onto a circuit board or the like. Some package types have multiple rocker type actuators engaging leaf-spring arm contacts within the switch to provide the switching function. Another package type is a multi-position switch having a sliding actuator containing a pole contact mounted on the underside of the actuator that selectively engages fixed contacts formed within the switch. Both type of DIP switch packages are enclosed within a plastic housing and have leads extending from the housing allowing the switch package to be connected to circuitry on the circuit board. The leads mate with through holes in the circuit board and are soldered into place. Examples of DIP switch packages are described in U.S. Pat. Nos. 4,031,345, 4,491,703, and 4,590,344.

Another type of electrical switch uses electrical contact pads formed on the circuit board as the fixed contacts of the switch. U.S. Pat. No. 4,013,885, assigned to the assignee of the present invention, describes a modular pushbutton switch that is removably mounted on a circuit board. The pole contact of the modular switch is attached to a pushbutton actuator that is secured in a insulative housing. The housing engages front and rear retaining members that are secured onto the circuit board containing the fixed contacts. The housing fits directly over the fixed contacts and movement of the actuator within the housing brings the pole contact into wiping engaging contact with the fixed contacts.

While the switches previously described are considered small devices occupying little area on a circuit board, the focus in the electronics industry is for smaller and smaller devices. As an example, surface mount technology has substantially reduced the size of integrated circuits and other type of electrical components. As a consequence, electronic test equipment manufacturers have been required to reduce the size of electrical test probes that are used to test these device and components. Most electrical test probes for electronic test equipment, such as oscilloscopes and the like, have an electrically conductive tubular outer body that is encapsulated in an insulating material. One end of the body contains a probing tip that is secured in the body using an insulating plug. A substrate is disposed within the tubular body and is electrically connected to the probing tip. The substrate, which may be a circuit board, has electrical components and circuit runs thereon proving probe compensation in relation to the input of the test equipment. The electrical circuitry on the circuit board and the tubular body are electrically connected to a transmission cable that is connected to the other end of the tubular body. The outer shielding conductor of the transmission line is generally connected to both the tubular body and to the circuit board to provide electrical ground coming from the test instrument. The center conductor is electrically connected to the circuit board for coupling the electrical signal present on the probing tip to the test instrument.

One type of electrical test probe in use today is a passive voltage probe. This type of probe has a compensated voltage divider network that presents a high resistive load to a device under test. Half of the voltage divider network is in the probe head while the other half is in the input to the test instrument. The voltage divider network may be configured to produce different levels of attenuation to an acquired signal. The most common attenuation factors used in passive voltage probes are one times ($1\times$), ten time ($10\times$), and one hundred times ($100\times$). Generally, the input resistance to an oscilloscope is 1 megohm. Therefore, a $10\times$ probe consists of a voltage divider network having 9 megohm resistor in the probe head and a 1 megohm resistor in the oscilloscope. In a $1\times$ probe, the electrical signal from the device under test is directly coupled through the probe head to the oscilloscope input via the probe transmission cable.

One type of passive voltage probe is a combination $1\times/10\times$ probe. A switch in the probe head routes the input signal either through the 9 megohm resistor in the probe head or directly to the transmission cable. The P6119 $1\times/10\times$ Switchable Passive Probe, manufactured by Tektronix, Inc., Beaverton, Oreg., the assignee of the present invention, is an example of such a switchable probe. The probe switch is an enclosed device having a rectangular shaped body that fits into a corresponding size hole in the probe head circuit board. Tabs extending outward from sides of the switch body are soldered to electrical contact pads formed on the circuit board. Internal to the switch, the tabs are coupled to fixed switch contacts. A sliding actuator in the switch has a pole contact formed on its bottom surface, which engages the various fixed switch contacts as the actuator is moved from one switch position to the next. The actuator is mechanically connected to a slide button on the outside of the probe through an aperture formed in the tubular outer body.

The diameter of the tubular outer body for this probe is substantially larger than the diameter of miniature passive probes used for probing surface mounted devices. This makes the probe difficult to use in probing such devices and circuits. To reduce the size of this probe to a miniature passive probe would require reducing the diameter of the tubular body. This would require surrounding the region of the circuit board containing the switch with an insulating material to meet the Underwriters Laboratories, UL, requirements for minimum through air and over surface distances between conductive elements and between conductive elements and a user for particular voltage ratings. For example, electrical equipment having a peak AC+DC voltage rating of 420 volts must have a minimum through air and over surface distance separation of 0.180 inches between conductive elements and between any exposed conductive element and a user. However, a portion of the insulating material would have to be removed to allow the mechanical connection between the switch actuator and the switch button on the outside of the probe. This modification would not maintain the minimum distance separation requirements set by UL.

What is needed is a switch design for a switchable passive probe that fits within the tubular body of a miniature passive probe while at the same time meeting the Underwriters Laboratories distance separation requirements for a 1× passive voltage probe capable of handling 420 volts peak AC.

SUMMARY OF THE INVENTION

Accordingly, the present invention is an electrical switch having a substrate with electrical contact pads formed thereon acting as fixed electrical switch contacts. A frame member is mounted on the substrate and is laterally displaced from the fixed electrical switch contacts. An actuator is disposed within the frame member and has an electrical contact acting as a switch pole extending from the actuator past the frame member. The switch pole electrical contact is in contact with the substrate for wipingly engaging the fixed electrical switch contacts as the actuator is moved from a first switch position to a second switch position. The switch further has a means for providing detented positioning of the actuator within the frame member in the various switch positions.

In a further aspect of the invention, the frame member has a movable electrical contact acting as a second switch pole for electrically contacting an additional electrical contact pad formed on the substrate underneath the frame member acting as another fixed electrical switch contact. The actuator has means for actuating the movable switch pole electrical contact formed in the frame member. The frame member may have a C-shaped cross-sectional channel structure with opposing sidewalls having inwardly transitioning flanges for holding the actuator within the frame member. In an additional aspect of the invention, the frame member is surface mounted on the substrate and is formed from an electrically conductive material for making the frame member a part of the electrical circuity on the substrate.

The electrical switch is usable in a switchable passive probe wherein the substrate on which the switch is mounted is disposed within an electrically conductive tubular body of the probe. The tubular body has an aperture formed therein that allows an externally positioned switch button to be mechanically connected to the actuator. The electrical probe has insulating material surrounding that portion of the substrate containing the fixed electrical switch contacts. The pole contact on the actuator moves into the electrically insulated portion of the substrate to wipingly engage the fixed electrical switch contacts on the substrate. The switch frame member, which is formed from an electrically conductive material, is surface mounted on the substrate and is a part of the electrical circuitry on the substrate permitting the second pole contact formed in the frame member to act as a readout switch. The readout switch provides a signal to the test instrument for changing the volts/division display on the instrument as a function of the probe attenuation factor.

The objects, advantages and novel features of the present invention are apparent from the following detailed description when read in conjunction with appended claims and attached drawings.

BRIEF DESCRIPTION OF THE DRAWINGS

FIG. 3 is a schematic diagram of an electrical circuit for a switchable passive probe using the switch according to the present invention.

FIG. 4 is a perspective underside view of the actuator of the electrical switch according to the present invention.

DETAILED DESCRIPTION OF THE PREFERRED EMBODIMENT

Figure 1:
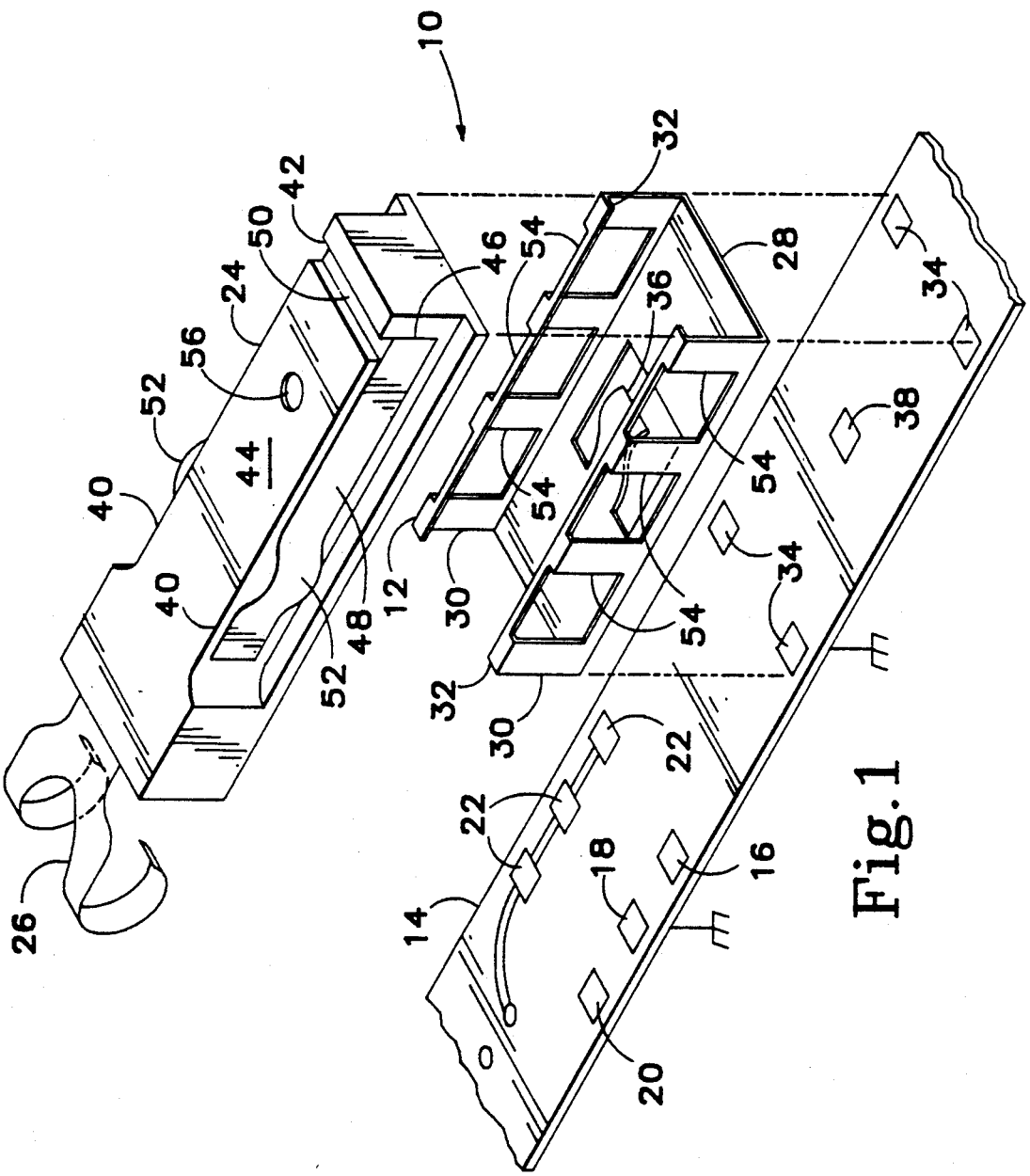
FIG. 1 is an exploded perspective view of the electrical switch according to the present invention.

Referring to FIG. 1 there is shown an exploded perspective view of the electrical switch 10 according to the present invention. In its broadest aspect, switch 10 is an laterally reaching, open structure device wherein the electrical switching occurs distant from the switch structure. That is, the movable switch pole is not positioned within the switch structure but instead extends past the structure to engage fixed switch contact that are positioned away from the structure. To this end, switch 10 has frame member or rail 12 mounted on a substrate 14, such as circuit board. Individual electrical contact pads 16, 18, 20, and common electrical contact pads 22 acting as fixed electrical switch contacts are formed on the circuit board 14 distant from the rail 12. An actuator 24 is slidably disposed within the rail 12. Actuator 24 has an electrical contact 26 acting as a switch pole that extends past the rail 12 for wipingly engaging the fixed electrical switch contacts 16, 18, 20, and 22 on the circuit board 14.

In the preferred embodiment of the invention, the rail 12 is rectangular shaped having a base 28 and vertical sidewalls 30 with the sidewalls 30 being parallel to the longitudinal axis of the rail. The sidewalls 30 have inwardly transitioning flanges 32 for holding the actuator 24 within the rail 12. Alternately, rail 12 may have dovetail type structure of inwardly angling sidewalls 30 for holding the actuator 24 within the rail 12. The rail 12 may be made of an electrically conductive material, such as nickel-plated beryllium-copper or the like, for surface mounting to electrical contact pads 34 formed on the circuit board 14. The electrical contact pads 34 may be connected to electrical circuitry on the circuit board 14 making the rail 12 part of the electrical circuitry. An electrical contact 36 acting as another switch pole may be formed in the electrically conductive rail 12. The rail switch pole 36 contacts an electrical contact pad 38 formed on the circuit board 14 acting as another fixed electrical switch contact. In such a configuration, switch 10 contains two independently acting switch poles 26 and 36 performing two separate switching functions. Alternatively, rail 12 may be formed from a non-conductive material and perform only the laterally reaching electrical switching function. In such an alternative design, the rail 12 may mounted to the circuit board 14 using an adhesive, such as UV-cured epoxy or other type material. The rail 12 may be flush mounted to the circuit board 14 or it may have protrusions, which fit into corresponding holes in the circuit board 14. It is also possible to affix or form a conductive run and contact on the rail 12, which is electrically connected to the electrical circuitry on the circuit board 14 to provide the second independent switching action.

The actuator 24 is essentially rectangular shaped and slidably fits within rail 12. One end of the actuator has the switch pole electrical contact 26, which in the preferred embodiment has a rams-head shape. Actuator 24 has indented side surfaces 40 and a notch 42 formed in its top surface 44 for receiving a spring clip 46. Spring clip 46 has spring biased fingers 48 extending along the indented side surfaces 40 of the actuator 24 and are connected together by a strut 50 that is positioned within notch 42. The spring biased finger 48 have outwardly extending protrusions 52 formed therein. Protrusions 52 engage apertures 54 formed in the sidewalls 30 of rail 12 to provide detented positioning of the actuator as it is moved from one switch position to the next. A cavity 56 is formed in the top surface 44 of actuator 24 for receiving a peg attached to a switch button.

Figure 2:
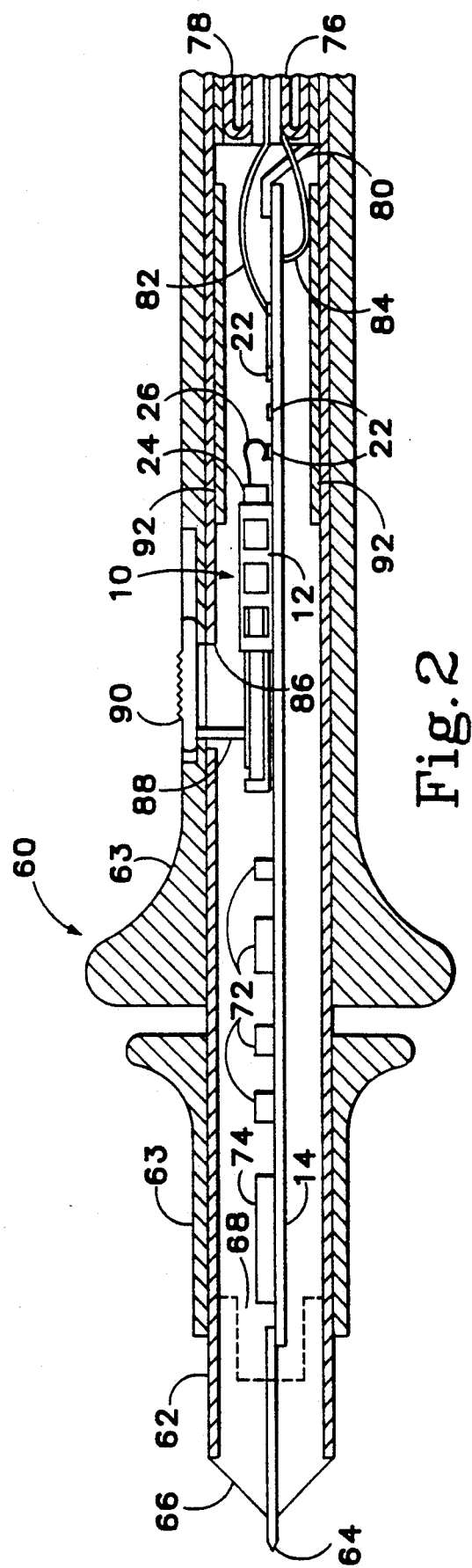
FIG. 2 is a partial cut-away side view of a switchable passive voltage probe using the electrical switch according to the present invention.

Switch 10 is ideally suited for small area applications where conventional enclosed switch structures would be to large to meet the Underwriters Laboratories standards (UL1244) for minimum over surface and through air distance separation between conductive elements and between conductive elements and a user for voltage rating in the hundreds of volts. One such application is in switchable passive voltage probes as is representatively shown in FIG. 2. Like elements in FIG. 2 appearing in FIG. 1 are labeled the same. Probe 60 has an electrical switch 10 for selectively coupling an electrical signal from a device under test to a test instrument either directly or through an attenuating circuit. The probe has a elongate tubular outer body 62 that is made from an electrically conductive material, such as nickel-plated beryllium-copper or the like. The tubular body has an inside diameter of 0.189 inches permitting its use in probing small pitch devices. A probing tip 64 is axially disposed within one end of the tubular body 62 and is electrically isolated from the tubular body by an insulating plug 66. One end of the probing tip 64 extends past the insulating plug 66 for probing a device under test. The other end is exposed within a bore 68 formed in the insulating plug 66. The bore 68 electrically isolates the probing tip 64 from the tubular body 62. Insulating material 63, such as a thermoplastic elastomer, is molded around a substantial portion of the tubular body 62 to provide electrical isolation for the probe 60.

The probing tip is electrically connected to circuit board 14 disposed within the tubular body 62. The circuit board 14 has electrical components 72 mounted thereon that are electrically connected together by conductive circuit runs (not shown) formed on the board 14. The components 72 form electrical circuitry, including one half of a compensated resistive attenuator network 74, which couples the electrical signal from the probing tip 64 to a transmission cable 76 connected to the other end of the tubular body 62. The transmission cable 76 has an outer shielding conductor 78 that is electrically connected to both the circuit board 14 and the tubular body 62 via a integral strain relief and ground connector 80, described in U.S. Pat. No. 5,061,892 and assigned to assignee of the present invention. The transmission cable center conductor 82 is electrically connected to the circuit board 14. An insulated readout wire 84 contained within the transmission cable 76 is also connected to the circuit board 14.

A slot 86 is formed in the tubular body 62 and the insulating material 63 for receiving a peg 88 that is connected to a switch button 90 mounted on the outside of the probe 60. Peg 90 engages the cavity 56 in the top surface 44 of the actuator 24 for moving the actuator 24 between the detented switch positions. A tubular insulating material 92 is disposed between the circuit board 14 and the tubular body 62 for electrically isolating the fixed electrical contact pads 16, 18, 20, and 22 on the circuit board 14 from the tubular body 62. Switch pole contact 26 laterally reaches into the area of the circuit board 14 protected by the insulating material 92 to make electrical contact with the fixed electrical contacts 16, 18, 20 and 22.

Probe 60 is designed for probing electrical signals having a maximum DC+AC voltage input level of 420 volts. Underwriters Laboratories requires over surface and through air separations of elements of 0.120 inches for this voltage level. For elements having a constant distance separation during manufacturing, such as the electrical pads 16, 18, 20, 22, 34, and 38, the over surface and through air separation is based on the break down voltage where arcing occurs between the pads. Generally UL recommends a distance separation of 0.080 inches. These requirements also hold true for electrical switch contacts. Since the inside diameter of the tubular body 62 is 0.189 inches and the circuit board 14 is approximately centered in the tubular body 62, electrical insulation is required between the tubular body 62 and the switching contacts of the switch. In prior art switches the switching contact are a part of the switch structure. However, in order for switching to take place, access to the outside of the tubular body 62 is required. This entails removing a portion of the electrical insulation around the switch so that a switch button 90 may be connected to the actuator of the switch. Since the circuit board 14 is approximately centered in the tubular body 62, the UL minimum distance separation standards would be violated. The diameter of the tubular body 62 would have to be increased to meet the UL requirements.

Switch 10 overcomes this problem by separating the actuating function of the switch from its electrical switching function. The area in which the switching function occurs is electrically isolated from the actuating function and meets the UL standards for through air and over surface separation. The actuating function occurs in an area requiring less stringent requirements.

FIG. 3 is a simplified schematic diagram of the electrical circuity contained on the circuit board 14 within the tubular body 62 of the switchable passive voltage probe 60. Probing tip 64 is coupled to the first half of the compensated resistive attenuator network 64, which may be a surface mounted hybrid circuit containing a resistor 100 and compensating capacitor 102. The other half of resistive attenuator network is an input resistor 104 in the test instrument 106 shunted by a capacitor 108. Most test and measurement instrument, such as oscilloscopes and the like, have an input resistance of 1 megohm. To produce a 10 times (10X) resistive attenuator network, resistor 100 is set to 9 megohms. Additional circuitry (not shown in FIG. 3) is generally provided on the circuit board 14 to compensate for roll off or peaking of the electrical signal. The attenuated electrical signal from the resistive attenuator network 64 is coupled via a circuit board run to switch contact 16 of switch 10. The probing tip is also electrically connected to switch contact 20 of switch 10 via an insulated circuit board run. Switch contact 18 is connected to electrical ground. The maximum rated peak AC+DC voltage on contact 20 is 420 volts requiring the use of insulating material 92 to isolate the voltage on contact 20 from the surrounding tubular body 62.

The center conductor 82 of transmission cable 76 is connected to the common switch contacts 22 of switch 10 while the readout wire 84 is connected to switch contact 38. Switch pole contact 26 is a sliding contact that selectively couples contacts 16, 18, or 20 to the common contact 22. Rail 12 is connected to electrical ground and contains the switch pole contact 36. Electrical connection is made between contact 36 and fixed electrical switch contact 38 by movement of the actuator 24 depressing contact 36 against contact 38.

FIG. 4 shows a perspective under side view of actuator 24. The bottom surface 110 of the actuator 24 has a central groove 112 extending partially along the longitudinal axis of the actuator 24. The groove angularly transitions into the bottom surface 110 of the actuator 24. Switch pole contact 36, which is formed with an upwardly extending protrusion 114, fits within the groove 112. Switching action of contact 36 is accomplished by the camming action of protrusion 114 riding up onto the bottom surface 110 of the actuator 24, thus forcing contact 26 down onto contact pad 38.

An electrical switch has been described where the electrical switching function is laterally displaced from the actuating function. Electrical contact pads are formed on a circuit board or the like that act as fixed electrical switch contacts. A frame member is mounted on the circuit board, which is laterally displaced from the fixed switch contacts. An actuator is disposed within the frame member and has an electrical contact acting as a switch pole extending from the actuator past the frame member for wipingly engaging the fixed electrical contacts as the actuator is moved between first and second switch positions. Such a switch is usable in a switchable electrical test probe where a circuit board is disposed within a electrically conductive tubular body containing electrical circuitry for providing both an attenuated or unattenuated electrical signal to a measurement test instrument. The fixed electrical contacts on the circuit board are electrically isolated from the tubular body by an insulating material. The switch pole electrical contact on the actuator reaches into the electrically isolated area containing the fixed switch contacts to perform the switching function between the attenuated and unattenuated electrical signals. These and other aspects of the present invention are set forth in the appended claims.

We claim:

1. An electrical switch comprising:
    a substrate having electrical contact pads formed thereon acting as fixed electrical switch contacts;
    a frame member mounted on the substrate being laterally displaced from the fixed electrical switch contacts; and
    an actuator disposed within the frame member having an electrical contact acting as a switch pole extending from the actuator past the frame member and contacting the substrate for wipingly engaging the fixed electrical switch contacts on the substrate as the actuator is moved between first and second switch positions.

2. The electrical switch as recited in claim 1 further comprising means for providing detented positioning of the actuator within the frame member in the first and second switch positions.

3. The electrical switch as recited in claim 1 wherein the frame member has a longitudinal axis and comprises a base and opposing sidewalls with the sidewalls parallel to the longitudinal axis and the movement of the actuator within the frame member being parallel to the longitudinal axis.

4. The electrical switch as recited in claim 3 wherein the frame member further comprises a movable electrical contact formed in the base acting as another switch pole for electrically contacting an additional electrical contact pad formed on the substrate underneath the frame member acting as another fixed electrical switch contact.

5. The electrical switch as recited in claim 4 wherein the actuator further comprises means for actuating the movable switch pole electrical contact formed in the frame member.

6. The electrical switch as recited in claim 4 wherein the frame member further comprises an approximately C-shaped cross-sectional channel structure with the opposing sidewalls having inwardly transitioning flanges for holding the actuator within the frame member.

7. The electrical switch as recited in claim 4 wherein the frame member is surface mounted on the substrate in electrical contact with electrical circuitry on the substrate, the frame member being an electrically conductive material and part of the electrical circuitry.

8. A multi-pole electrical switch comprising:
    a substrate having electrical contact pads formed thereon acting as fixed electrical switch contacts;
    a frame member mounted on the substrate being disposed over one of the fixed electrical switch contacts and laterally displaced from the other fixed electrical switch contacts, the frame member having a movable electrical contact formed therein acting as a switch pole for electrically contacting the fixed electrical switch contacts disposed under the frame member; and
    an actuator disposed within the frame member having means for actuating the movable switch pole electrical contact formed in the frame member as the actuator is moved between first and second switch positions and an electrical contact acting as another switch pole extending from the actuator past the frame member contacting the substrate for wipingly engaging the other fixed electrical switch contacts on the substrate as the actuator is moved between the first and second switch positions.

9. The electrical switch as recited in claim 8 further comprising means for providing detented positioning of the actuator within the frame member in the first and second switch positions.

10. The electrical switch as recited in claim 8 wherein the frame member has a longitudinal axis and comprises a base and opposing sidewalls with the sidewalls parallel to the longitudinal axis and the movement of the actuator within the frame member being parallel to the longitudinal axis.

11. The electrical switch as recited in claim 10 wherein the frame member further comprises an approximately C-shaped cross-sectional channel structure with the opposing sidewalls having inwardly transitioning flanges for holding the actuator within the frame member.

12. The electrical switch as recited in claim 8 wherein the frame member is surface mounted on the substrate in electrical contact with electrical circuitry on the substrate, the frame member being an electrically conductive material and part of the electrical circuitry.

13. A switchable electrical test probe for selectively coupling an electrical signal to a measurement test instrument either directly or through an attenuating circuit wherein the electrical signal is coupled to a substrate disposed within an electrically conductive tubular body by a probing tip disposed in one end of the tubular body and coupled from the substrate to the measurement test instrument by a transmission cable with the transmission cable having a center conductor electrically connected to a first electrical connection on the substrate and an outer conductor electrically connected to the tubular body and a second electrical connection on the substrate, the probe comprising:

electrical contact pads formed on the substrate acting as fixed electrical switch contacts with individual contacts being coupled to the probing tip and the attenuating circuit and a common contact being coupled to the center conductor of the transmission cable;

a frame member mounted on the substrate being laterally displaced from the fixed electrical switch contacts;

an actuator disposed within the frame member having an electrical contact acting as a switch pole extending from the actuator past the frame member and contacting the substrate for wipingly engaging the fixed electrical switch contacts on the substrate as the actuator is moved between first and second switch positions;

an insulating member disposed between the tubular body and the substrate for electrically isolating the switch pole electrical contact and the fixed electrical switch contacts from the tubular body; and means for moving the actuator between the first and second switch positions, the moving means being laterally displaced from the electrically isolated switch pole electrical contact and the fixed electrical switch contacts.

14. The switchable electrical test probe as recited in claim 13 further comprising means for providing detented positioning of the actuator within the frame member in the first and second switch positions.

15. The switchable electrical test probe as recited in claim 13 wherein the frame member has a longitudinal axis and comprises a base and opposing sidewalls with the sidewalls parallel to the longitudinal axis and the movement of the actuator within the frame member being parallel to the longitudinal axis.

16. The switchable electrical test probe as recited in claim 15 wherein the frame member further comprises a movable electrical contact formed in the base acting as another switch pole for electrically contacting an additional electrical contact pad formed on the substrate underneath the frame member acting as another fixed electrical switch contact.

17. The electrical test probe as recited in claim 16 wherein the actuator further comprises means for actuating the movable switch pole electrical contact formed in the frame member.

18. The switchable electrical test probe as recited in claim 16 wherein the frame member further comprises an approximately C-shaped cross-sectional channel structure with the opposing sidewalls having inwardly transitioning flanges for holding the actuator within the frame member.

19. The switchable electrical test probe as recited in claim 16 wherein the frame member is surface mounted on the substrate in electrical contact with electrical circuitry on the substrate, the frame member being an electrically conductive material and part of the electrical circuitry.

* * * * *